US005665656A

United States Patent [19]

Jairath

[11] Patent Number: 5,665,656

[45] Date of Patent: Sep. 9, 1997

[54] METHOD AND APPARATUS FOR POLISHING A SEMICONDUCTOR SUBSTRATE WAFER

[75] Inventor: Rahul Jairath, Austin, Tex.

[73] Assignee: National Semiconductor Corporation, Santa Clara, Calif.

[21] Appl. No.: 443,133

[22] Filed: May 17, 1995

[51] Int. Cl.$^6$ .................... H01L 21/304

[52] U.S. Cl. .................... 438/692; 156/345; 451/41; 451/283; 451/285; 451/287; 451/288; 438/693

[58] Field of Search .................... 437/228; 156/636.1, 156/645.1, 345; 451/283, 285, 287, 288, 41

[56] References Cited

U.S. PATENT DOCUMENTS

| | | | |
|---|---|---|---|
| 2,618,911 | 11/1952 | Indge | 451/287 |
| 2,730,851 | 1/1956 | Wallace | 451/41 |
| 3,461,617 | 8/1969 | Wright . | |
| 3,872,626 | 3/1975 | White | 51/129 |
| 4,267,114 | 5/1981 | Takano et al. | 156/645 |
| 4,593,495 | 6/1986 | Kawakami et al. | 51/118 |
| 4,607,496 | 8/1986 | Nagaura | 62/64 |
| 4,707,945 | 11/1987 | Arai | 51/118 |
| 5,016,399 | 5/1991 | Vinson | 51/118 |
| 5,035,087 | 7/1991 | Nishiguchi et al. | 51/131.1 |
| 5,081,051 | 1/1992 | Mattingly et al. | 437/10 |
| 5,265,378 | 11/1993 | Rostoker | 51/165.75 |
| 5,320,706 | 6/1994 | Blackwell | 156/636 |
| 5,389,579 | 2/1995 | Wells | 437/225 |
| 5,486,131 | 1/1996 | Cesna et al. | 451/56 |
| 5,487,697 | 1/1996 | Jensen | 451/41 |
| 5,531,861 | 7/1996 | Yu et al. | 156/636.1 |

FOREIGN PATENT DOCUMENTS

| | | | |
|---|---|---|---|
| 0046604 | 3/1982 | European Pat. Off. | 451/41 |

*Primary Examiner*—Charles L. Bowers, Jr.
*Assistant Examiner*—Matthew Whipple
*Attorney, Agent, or Firm*—Skjerven, Morrill, MacPherson, Franklin & Friel

[57] ABSTRACT

A semiconductor wafer polishing apparatus includes a housing and a turntable mounted in the housing. The turntable has an axis of rotation and a surface for affixing a semiconductor wafer. The polishing apparatus also includes a motor mounted to the housing and connected to the turntable to supply a torque for rotating the turntable about the axis of rotation. A polishing assembly is connected to the housing and extends adjacent to the turntable surface. A polishing pad is affixed to the polishing assembly and is positionable to contact the semiconductor wafer. Some polishing pads are cylindrical in form. Other polishing pads have a conical form.

12 Claims, 5 Drawing Sheets

METHOD AND APPARATUS FOR POLISHING A SEMICONDUCTOR SUBSTRATE WAFER

FIELD OF INVENTION

The present invention relates to silicon wafer cleaning systems and more particularly to an apparatus and method for polishing semiconductor wafers.

BACKGROUND OF THE INVENTION

During VLSI fabrication, meticulously clean silicon wafers are critical for obtaining high yields and suitable performance characteristics of semiconductor devices. Removal of impurities from the wafer surface is important because impurities may diffuse into the semiconductor substrate during subsequent high-temperature processing, altering the substrate bulk and surface properties. Some impurities are donor or acceptor dopants which directly affect device performance characteristics. Other impurities cause surface or bulk defects such as traps, stacking faults or dislocations. Surface contaminants such as organic matter, oil or grease lead to poor film adhesion. The various types of impurities and contaminants must be removed by careful cleaning, such as chemical or ultrasonic cleaning at initiation of silicon processing and in various appropriate steps during processing.

Silicon processing typically begins with a cleaning step involving wafer scrubbing to remove loose particulate contaminants. Particulates are bits of material present on a wafer surface that have easily definable boundaries such as various dusts (atmospheric, silicon and quartz), link, photoresist chunks and bacteria. Particulates are generally removed using a process herein called a cleaning process. Material that is too small to be measurable is herein referenced as "material", which is generally removed using a polishing process.

Subsequent to a cleaning process, treatment with organic solvents, such as trichloroethylene, acetone, p-xylene, methanol and ethanol, is performed to remove organic impurities such as hydrocarbons and greases which remain from a prior wafer-grinding process. A final cleaning step includes treatment with several various inorganic chemicals to remove heavy metals, for example. These inorganic chemical mixtures are strong oxidants, which form a thin oxide layer at the wafer surface. This oxide layer is stripped, removing impurities absorbed into the oxide layer.

Chemical cleaning for removing chemically bonded films from wafer surfaces is one step in a cleaning process. Conventional chemical cleaning includes a series of acid and rinse baths.

Various silicon wafer cleaning systems are commercially available which clean wafers using mechanical scrubbing. A conventional silicon wafer cleaning machine utilizes a polishing pad affixed to a rotating turntable wherein the polishing surface of the polishing pad faces upward. The rotating turntable is commonly rotated at various controlled speeds, for example from 10 to 100 RPM, in a controlled clockwise or counterclockwise direction. A silicon wafer, generally in the form of a flat, circular disc, is held within a carrier assembly with the substrate wafer face to be polished facing downward. The carrier assembly is affixed to an arm and lever so that a downward force is applied to the silicon wafer against the polishing pad. In some systems, the carrier assembly is motorized so that a rotational motion is applied to the silicon wafer. The wafer is also rotated by the carrier assembly at various controlled speeds in a controlled clockwise or counterclockwise direction. The relative speeds and rotation directions of both the turntable and the wafer are controlled independently so that the speeds and rotation directions may be the same or different.

The polishing pad and turntable are much larger than the silicon wafer. For example, a typical diameter of the pad and turntable is 22 inches while a wafer commonly has a diameter of approximately 10 inches. The carrier assembly is positioned in various places with respect to the pad and turntable using a mechanism such as a robotic arm. During a wafer polishing process, the carrier arm and wafer is moved about to various positions overlying the polishing pad.

The polishing process operates by rotating a polishing pad and bringing a silicon wafer into contact with the polishing pad as a liquid solvent slurry is applied. The silicon wafer contacts the polishing pad under pressure of a downward force applied to the silicon wafer. The amount of downward pressure applied to the carrier assembly is controlled. A mechanical cleaning process cleans by placing various solvents in the slurry into motion. One slurry typically includes a solution of silicon dioxide and potassium hydroxide. In another example, slurry is composed of silicon dioxide and ammonium hydroxide or some other amine. The moving solvent aids in removal of material. The combined action of the applied downward force, rotating actions of the wafer and the polishing pad and the physical-chemical action of the polishing slurry results in the removal of material from the substrate wafer.

The polishing pad is typically fabricated from a polyurethane and/or polyester-based material. The polishing process degrades the polishing material, reducing polishing performance. To restore the polishing material and improve polishing performance, a conventional polishing machine periodically reconditions or dresses the pad. The reconditioning process involves application of an abrasive material, such as a diamond surface including sharp particles or structures, to the pad. The abrasive material is used to erode the surface of the polishing pad in a controlled manner, thereby reviving the pad surface and restoring polishing performance. A conventional polishing apparatus uses a separate abrasive assembly held by an arm which extends approximately from the center of the turntable radially outward. The abrasive assembly is controlled to move back and forth, over the rotating turntable to restore the pad as the turntable spins and away from the turntable when restoration is complete.

After the wafer is polished, removed particles are washed from the wafer surface by transferring the wafer to a separate washing apparatus. Thus the wafer polishing process includes two steps, a polishing step and a washing step.

Performance of the polishing step depends on the relative motion of the polishing pad and the substrate. Particulate removal varies with the linear velocity of the wafer which moves with respect to the polishing pad. For any point on a rotating body, angular velocity can be converted to linear velocity. The linear velocity depends not only on the angular velocity but also on the distance of the point from the center of rotation. If the distance is doubled for the same angular velocity, the linear velocity of the point is doubled. One problem with conventional wafer cleaning systems is that the linear velocity at any point on the wafer can change rapidly, a local acceleration that stresses the wafer surface. A consequence of the high local accelerations on the wafer surface is that a greater amount of material is removed at a point, reducing polishing uniformity. Another problem that arises with conventional wafer cleaning systems is that the linear velocity of any point on the wafer, relative to the pad, cannot be suitably controlled. The independent rotational motion directions and angular velocities and the variable relative positioning of the wafer and pad engender a highly complex dynamic system which is difficult to model and control. One consequence of the dynamic complexity of the conventional polishing system is that the wafer is not polished uniformly. Polishing specifications typically require a high uniformity to tight tolerances. For example, silicon dioxide processing typically specifies the removal of approximately one micron of film. Often less than one micron of film is specified to be removed for metal applications. Another consequence is that a much longer polishing time is required, reducing semiconductor fabrication efficiency and productivity and increasing manufacturing costs.

An additional problem is that, just as the dynamic complexity of the conventional system makes uniform polishing of the wafer difficult, uniform degradation and restoration of the polishing pad are similarly rendered onerous. The combination of nonuniformity of polishing and nonuniformity of the condition of the polishing pad make the specification of high uniformity to tight tolerances very difficult to achieve.

Furthermore, the local accelerations that stress the wafer surface also cause local stresses on the polishing pad, tearing at the pad and reducing the operational life of the pad. High wear and tear on the polishing pad diminishes fabrication productivity due to down time of the polishing apparatus and increases manufacturing costs both because of the reduced operational time and the cost of replacing polishing pads.

Another problem is that conventional wafer cleaning systems utilize a polishing pad which is much larger than the substrate wafers. Slurry must be generously applied to the entire pad so that the large pad necessitates the usage of large amounts of chemical solvents, making the cleaning process sloppy, increasing cleaning costs and maintenance costs (due to the corrosive character of many solvents), and increasing the usage and therefore the cost of chemicals.

A further additional problem arises with respect to the slurry application in a conventional wafer cleaning system. The downward pressure of the carrier assembly and wafer on the rotating polishing pad is concentrated at the center point of the wafer. Therefore, slurry is forced away from the center of the wafer so that the slurry is not applied uniformly to the wafer.

Usage of a polishing pad in the form of a large thin disk makes replacement of the pad difficult. The polishing pad is affixed to the turntable with an adhesive. The pad is removed by merely tipping up the pad, thereby releasing bonding of the pad. Unfortunately, after polishing of numerous wafers, the pad is thoroughly soaked with slurry which is often toxic, volatile and corrosive.

In addition, utilization of a large polishing pad requires the cleaning system, as a whole, to be very large, requiring a large mount of floor space and thereby increasing manufacturing costs. Furthermore, complete enclosure of the large systems is difficult, making ventilation of toxic and unpleasant chemicals burdensome and expensive.

SUMMARY OF THE INVENTION

In accordance with a first embodiment of the present invention, a semiconductor wafer polishing apparatus includes a housing and a turntable mounted in the housing. The turntable has an axis of rotation and a surface for affixing a semiconductor wafer. The polishing apparatus also includes a motor mounted to the housing and connected to the turntable to supply a torque for rotating the turntable about the axis of rotation. A polishing assembly is connected to the housing and extends adjacent to the turntable surface. A polishing pad is affixed to the polishing assembly and is positionable to contact the semiconductor wafer. Some polishing pads are cylindrical in form. Other polishing pads have a conical form.

Some embodiments of the present invention also include a member mounted in the polishing assembly, having an axis of rotation and having a surface for affixing the polishing pad. In these embodiments a polishing assembly motor is mounted to the polishing assembly and connected to the member to supply a torque for rotating the polishing pad about the member axis of rotation.

In accordance with another embodiment of the present invention, a method of polishing a semiconductor wafer includes the steps of affixing a semiconductor wafer to a turntable, rotating the turntable and affixed semiconductor wafer at a controlled angular velocity and direction, positioning a polishing pad at a selected location relative to the semiconductor wafer, and pressing the polishing pad into contact with the rotating semiconductor wafer at a controlled pressure. The polishing pad is rotated at a selected angular velocity and direction. The polishing pad is reconditioned by bringing the rotating polishing pad into contact with an abrasive material.

One advantage of the polishing apparatus and method disclosed herein is that the wafer and polishing pad are precisely aligned so that material is removed uniformly across the wafer surface to a very high tolerance specification.

Another advantage of the polishing apparatus and method of the present invention is that the structure of the turntable, the affixation of the wafer to the turntable and the positioning of the polishing pad with respect to the turntable inherently provide for a great reduction in size of the overall system. This substantial reduction in system size advantageously allows several systems to be placed in a workspace that a single conventional system would require. Furthermore, this substantial reduction in size allows for complete enclosure of the polishing system and suitable venting of toxic gases released within the interior chamber of the enclosure. Thus the polishing apparatus of the present invention promotes environmental protection and safety considerations. Additionally, the substantially reduced size is achieved through the utilization of system components which are also greatly reduced in size. Because of the small size of these components, the torque to achieve a desired angular velocity is substantially reduced in comparison to the torque required for conventional polishing systems. Accordingly, much greater rotational speeds of both the substrate wafer and the polishing pad are possible for the polishing apparatus of the present invention, in comparison to a conventional system, using motors of similar performance characteristics. The greater rotational speeds advantageously enhance material removal rates.

A further advantage of the polishing apparatus and method of the present invention is that the small size of system components allows the polishing apparatus to be easily cleaned and easily transported for cleaning. In one example, the polishing apparatus is cleaned by placing the apparatus in a shower and spraying away waste materials and chemicals.

A further advantage of the polishing apparatus and method of the present invention is that a wafer is both polished and cleaned using a single apparatus. The wafer rotates in position on a single turntable while polishing and cleaning operations are performed by bringing polishing and cleaning pads into contact with the rotating wafer. This feature is made possible by the reduced size of the components of the polishing apparatus.

An additional advantage of the polishing apparatus and method is that the downward force of the polishing pad upon the wafer is not concentrated at a point but is rather spread along a line of intersection of the cylindrical or conical surface of the polishing pad and the flat surface of the wafer so that slurry is applied uniformly to the wafer surface. As a consequence, the uniformity of the polished surface is greatly improved.

A further advantage of the system and apparatus disclosed herein relates to replacement of a polishing pad. The small size and convenient configuration of a polishing pad as a cylinder or cone allows for rapid removal and disposal of the pad, much in the manner of changing a paint roller. Thus, handling of a slurry-soaked pad is largely reduced.

This invention will be more fully understood in light of the following detailed description taken together with the drawings.

DETAILED DESCRIPTION

Figure 1:
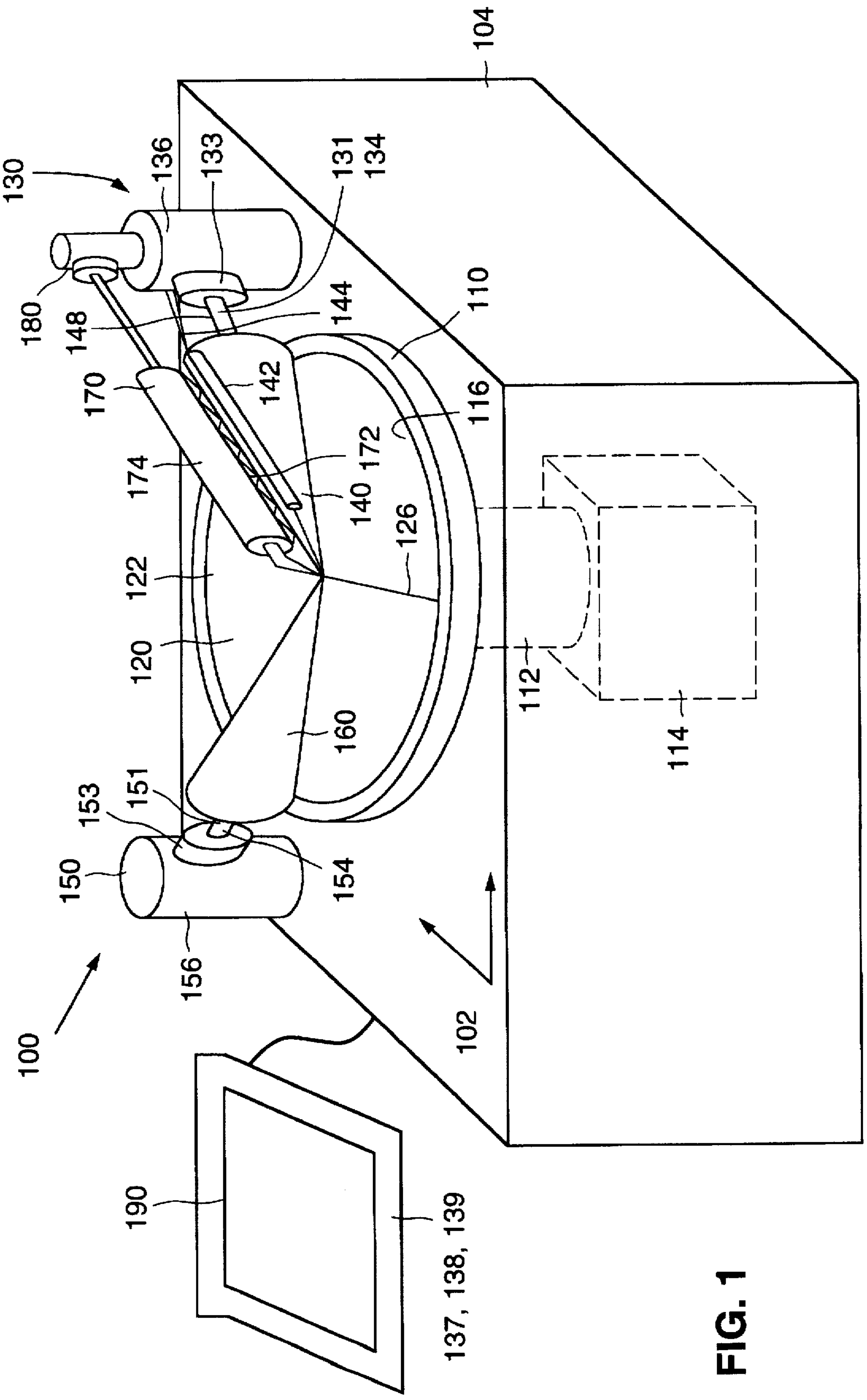
FIG. 1 illustrates a schematic mixed pictorial and block diagram of an embodiment of a polishing apparatus in accordance with the present invention.
Figure 2A:
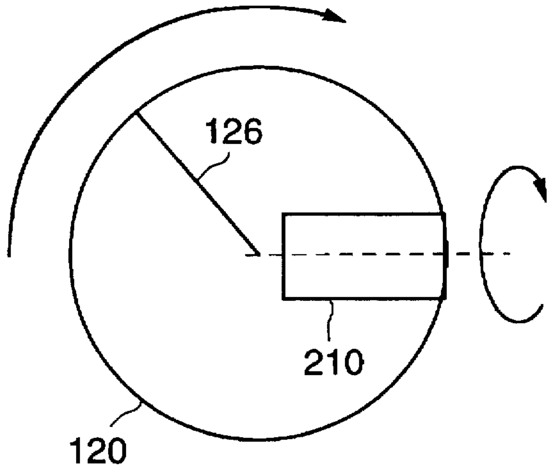
FIGS. 2(*a*) through 2(*g*) show several pictorial views of exemplary polishing pads in various sizes and shapes.
Figure 2B:
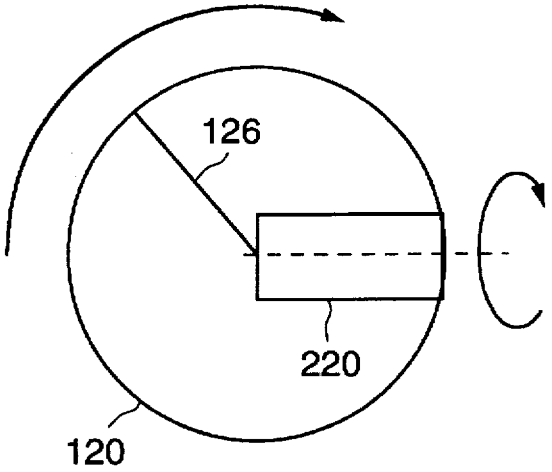
Figure 2C:
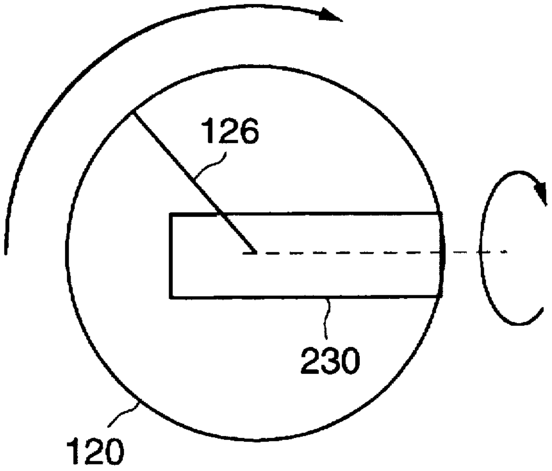
Figure 2D:
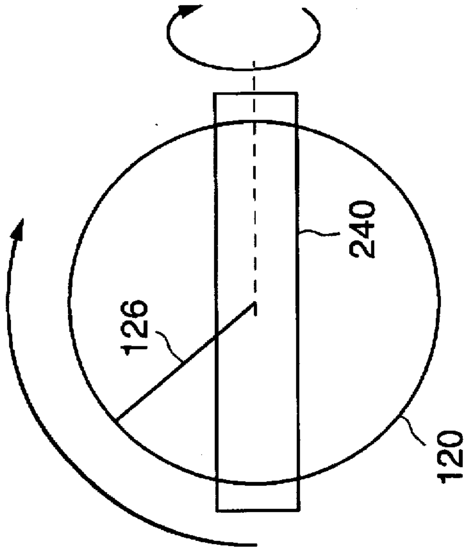
Figure 2E:
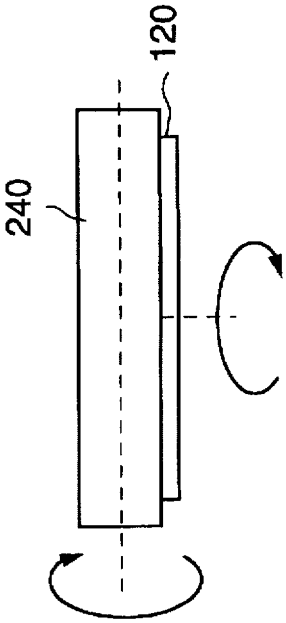
Figure 2F:
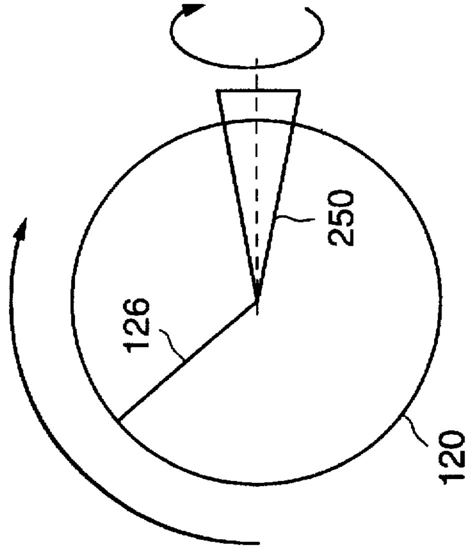
Figure 2G:
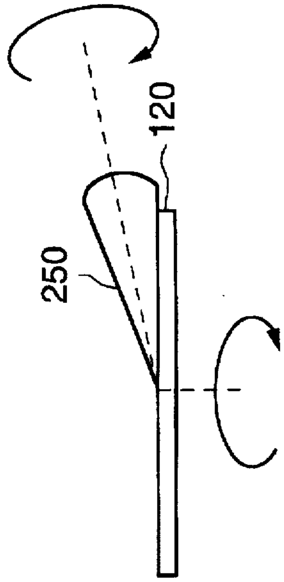

Referring to FIG. 1, an embodiment of the polishing apparatus 100 is shown which includes a housing 104, a flat cylindrical turntable 110 and a polishing assembly 130. The turntable 110 centers and firmly holds a semiconductor substrate wafer 120. The polishing assembly 130 holds a polishing pad 140. The polishing apparatus 100 also includes a cleaning assembly 150 for holding a cleaning pad 160 and a pad reconditioner 170 mounted upon a movable mounting structure 180.

The turntable 110 is a thin, flat cylindrical plate with the flat surface disposed in a horizontal plane 102. The turntable 110 has a size which approximates the size of the silicon substrate wafer 120 which is processed. For example, the described wafer 120 and turntable 110 each have a diameter of approximately 10 inches. The turntable 110 is rotated about a central axis rod 112 by a first motor 114. The rotational speed and direction of the turntable 110 is controlled via operator controls (not shown). Relatively fast rotational speeds, for example from 500 to 1000 RPM, are feasible in the polishing apparatus 100 due to the small sizes of the turntable 110 since less torque is required to achieve a desired angular velocity when small components are rotated. The substrate wafer 120 is typically a thin, flat circular disk having a flat surface that is disposed in the horizontal plane 102. The substrate wafer 120 is affixed to an upward-facing surface 116 of the turntable 110 with a process surface 122 of the wafer 120 facing upward for processing.

In some embodiments, the polishing assembly 130 includes a polishing spindle 131, which has the structure of an elongated rod, for holding a polishing pad 140. A slurry applicator 142 is positioned in the vicinity of the polishing pad 140 and fed slurry through a tube 144 for uniform application to the polishing pad 140. The polishing spindle 131 moves along a track 148 overlying the turntable 110 and wafer 120 and is connected to a carrier arm 133 which positions and seats the spindle 131 overlying the turntable 110 and wafer 120 and applies downward pressure on the turntable 110 and wafer 120. The spindle 131 is rotated about a spindle central axis rod 134 by a second motor 136. The rotational speed and direction of the spindle 131 is controlled via operator controls on a control panel 190 including a positioning device 138, such as a lever, mouse or trackball, for positioning the polishing assembly 130 with respect to the wafer 120. Operator controls on the control panel 190 also include a speed control 137 to control the speed of the rotating spindle 131 and an actuator 139 which engages the polishing spindle 131 to begin a rotating motion. Advantageously, very fast rotational speeds are feasible in the polishing assembly 130 because of the small radius of the polishing apparatus 100 and a center of mass of the polishing assembly 130 that is substantially the same as the center of rotation so that only a small applied force rotates the polishing assembly 130 suitably.

In the illustrative embodiment, the polishing assembly 130 includes several spindle attachments of various sizes and shapes for holding polishing pads of corresponding sizes and shapes. FIGS. 2(*a*) through 2(*g*) illustrate several exemplary sizes and shapes of polishing pads. A polishing pad 140 is constructed from a polyurethane and/or polyester-based material. FIG. 2(*a*) depicts top view of a polishing pad 210 which is cylindrical in shape and has a length which is less than the radius 126 of the substrate wafer 120. FIG. 2(*b*) shows a top view of a polishing pad 220 which is cylindrical in shape and has a length which is essentially equal to the radius 126 of the substrate wafer 120. FIG. 2(*c*) shows a top view of a polishing pad 230 which is cylindrical in shape and has a length which is greater than the radius 126 of the substrate wafer 120 but less than or equal to the diameter of the wafer 120. FIGS. 2(*d*) and 2(*e*) respectively illustrate a top view and a side view of a polishing pad 240 which is cylindrical in shape and has a length which is greater than the diameter of the wafer 120. FIGS. 2(*f*) and 2(*g*) respectively show a top view and a side view of a polishing pad 250 which is conical in shape and has a length which is essentially equal to the radius 126 of the substrate wafer 120. A rotating conical polishing pad generates lower linear velocities near the tip of the cone and generates higher linear velocities toward the base of the cone. In contrast, a cylindrical polishing pad such as pads 210, 220, 230 and 240 produce a constant linear velocity along the length of the cylinder. For conical polishing pad 250, the length L and the conical angle $\theta$ of the cone are selected to vary the relative linear velocities at particular points on the wafer surface and to control the variation in polishing performance across the wafer surface. The conical polishing pad 250 advantageously furnishes a technique for applying a velocity gradient or velocity profile to the wafer surface.

In operation, a user of the polishing apparatus 100 may oscillate the conical polishing pad 250 about the center of the wafer 120 so that the portion of the pad 250 near the base of the cone, which moves at a high linear velocity with respect to a point on the wafer surface by virtue of the angular motion of the cone, is frequently positioned overlying points on the wafer surface near the center of the wafer, which move with a low linear velocity by virtue of the angular motion of the wafer.

For various sizes and shapes of polishing pads, rotating speeds and directions of the pad 140 and wafer 120, and the polishing pressure applied to wafer 120 by the polishing assembly 130 are controlled to improve polishing performance for removal of particular types of films and for polishing of varioustypes of substrates. Furthermore, the size and shape of the polishing pad 140 is selected to fulfill process and manufacturing specifications such as material removal rates, uniformity of removal across the substrate wafer, and wafer flatness after polishing.

Referring again to FIG. 1, the cleaning assembly 150 is similar in structure and function to the polishing assembly 130 and includes a cleaning spindle 151 in the form of an elongated rod for holding a cleaning pad 160. The cleaning spindle 151 is connected to a carrier arm 153 which positions the spindle 151 with respect to the turntable 110 and wafer 120. The spindle 151 is rotated about a spindle central axis rod 154 by a third motor 156. The rotational speed and direction of the spindle 151 are controlled via operator controls (not shown). The spindle 151 and carrier arm 153 are suitably strong and durable to furnish stability as a firm downward pressure is applied to the wafer 120 by the cleaning assembly 150 holding the cleaning pad 160.

The cleaning assembly 150 and cleaning pad 160, like the polishing assembly 130 and pad 140, employ several spindle attachments of various sizes and shapes for holding cleaning pads of corresponding sizes and shapes, including the cylindrical and conical shapes. The cleaning pad 160 differs from the polishing pad 140 in composition, the cleaning pad 160 being constructed from buffed polyurethane or poly-vinyl alcohol (PVA) based brushes. The cleaning pad 160 is used at the completion of a wafer polishing operation to clean the substrate wafer 120.

The cleaning assembly 150 and the polishing assembly 130 provide for selective application of the cleaning pad 160 and the polishing pad 140, respectively so that process steps of polishing a wafer 120, then cleaning the wafer 120 are accomplished without removing the wafer 120 from the turntable 110. The wafer 120 rotates in position on a single turntable while polishing and cleaning operations are alternately performed by sequentially bringing a polishing pad 140 and then a cleaning pad 160 into contact with the rotating wafer 120.

Figure 3:
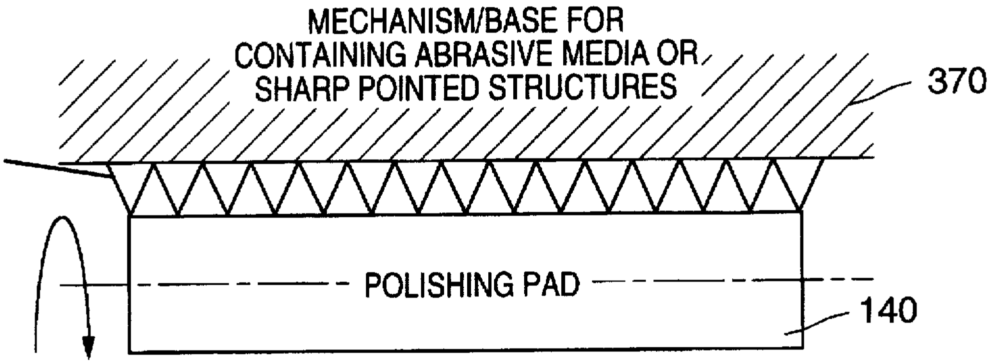
FIG. 3 depicts a pictorial view of a pad re, conditioner for usage with a cylindrical polishing pad.
Figure 4:
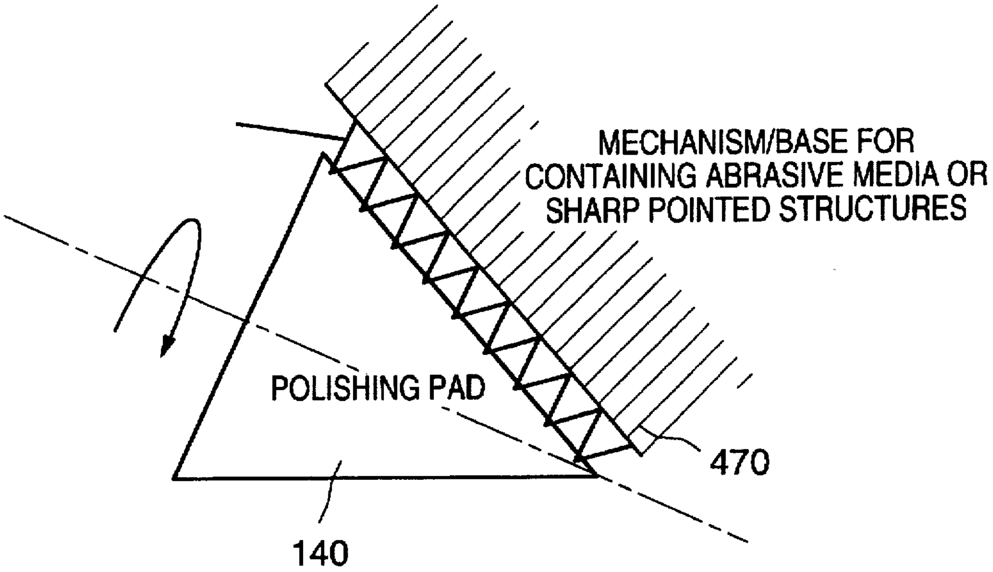
FIG. 4 illustrates a pictorial view of a pad reconditioner for usage with a conical polishing pad.

The pad reconditioner 170 is a block of abrasive material which is mounted upon a movable mounting structure 180 for application to a polishing pad 140 to condition or dress the polishing pad 140. The pad reconditioner 170 includes an array of abrasive particles 172 held on a block of base material 174. The abrasive particles 172, which are constructed from a suitable hard and sharp material, such as diamond, are controlled to come into contact to the polishing pad 140, thereby restoring the pad. The pad reconditioner 170 is positioned, under the control of an operator, either adjacent to the polishing pad 140 or removed from the pad, to either periodically or continuously abrade the surface of the polishing pad 140. The pad reconditioner 170 provides for performance of pad reconditioning or dressing while the polishing process is in operation, thus improving polishing performance by avoiding polishing using a degraded polishing pad. FIG. 3 depicts a pad reconditioner 370 for a cylindrical polishing pad. FIG. 4 illustrates a pad re, conditioner 470 for a conical polishing pad.

Figure 5:
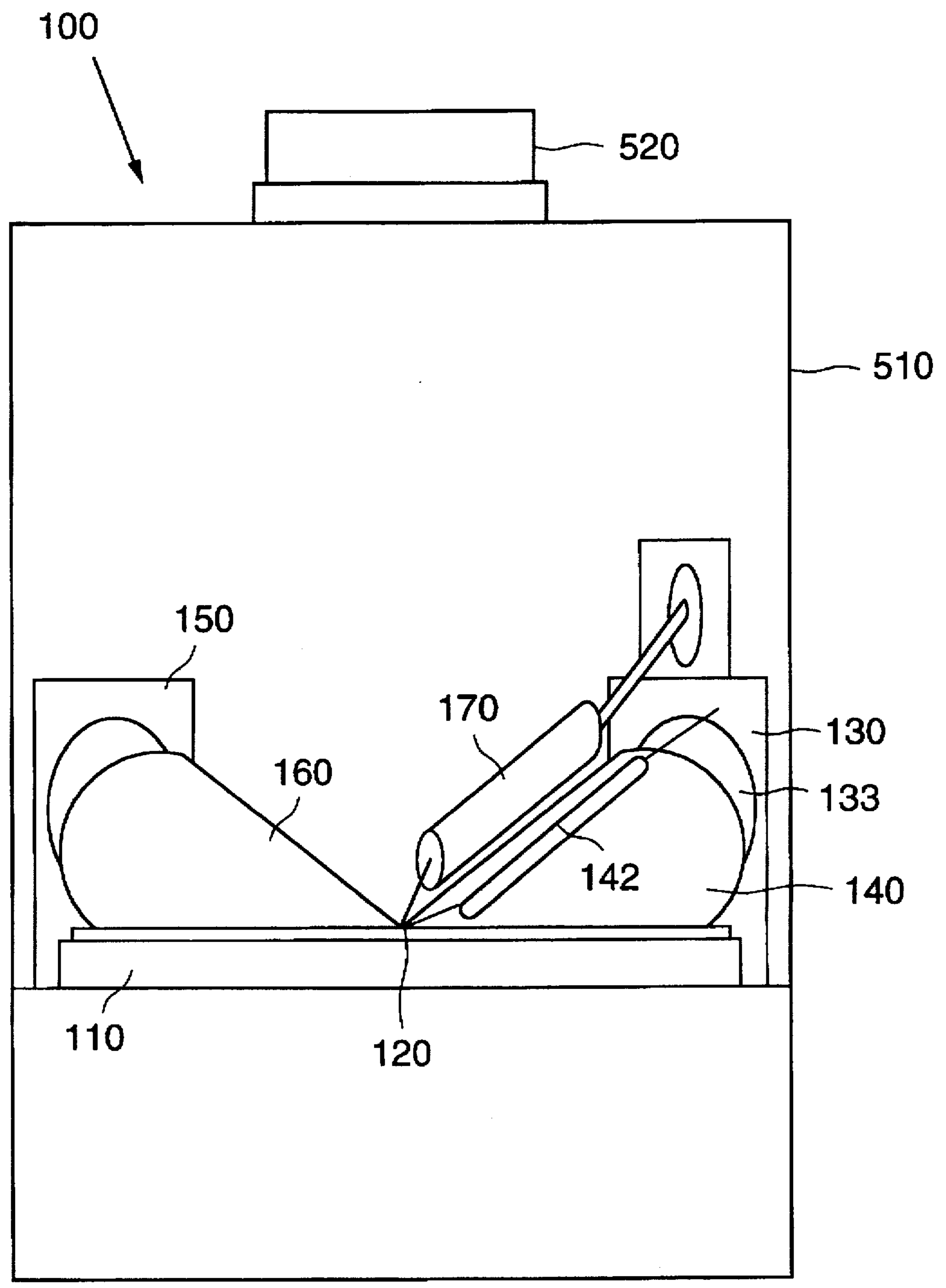
FIG. 5 shows a frontal pictorial view of a polishing apparatus which is enclosed within an enclosure.

Referring to FIG. 5, a frontal pictorial view of the polishing apparatus 100, enclosed within an enclosure 510, is shown. The small size of the turntable 110 and other components allows for a large reduction in size of the apparatus so that complete enclosure is enabled. Complete closure of the apparatus 100 is advantageous for incorporating an exhaust system for removing toxic and volatile chemicals. An exhaust duct 520 is tightly attached to the enclosure 510 to allow venting of toxic materials. The enclosure 510 forms a cubic structure having sides of approximately 12" in length for an 8" diameter substrate wafer. Suitably enlarged structures are utilized to accommodate proportionately larger sized substrate wafers.

The small size of the structure advantageously allows the polishing apparatus 100 to be easily transported for cleaning. For example, the apparatus 100 can be cleaned by merely transporting the enclosure 510 to a shower and spraying chemicals out of the apparatus 100 or by simply installing a shower in the apparatus 100.

The polishing apparatus 100 polishes and cleans a semiconductor wafer 120 in the following manner. The wafer 120 is firmly attached to the turntable 110, a suitable polishing pad 140 is attached to the polishing assembly 130 and a cleaning pad 160 is connected to the cleaning assembly 150. The size and shape of the polishing pad 140 is selected to fulfill process and manufacturing specifications such as material removal rates, uniformity of removal across the substrate wafer, and wafer flatness after polishing.

The polishing apparatus 100 rotates the turntable 110 at an angular velocity and direction which is controlled, for example, manually by an operator or automatically using a computerized control routine. The polishing pad 140 is positioned in a selected location relative to the wafer 120 and a controlled downward pressure is applied by the carrier arm 133 to the polishing pad 140 to begin polishing the wafer 120. The polishing assembly 130 is controlled to rotate the polishing pad 140 at a selected angular velocity and direction and to apply a controlled flow of slurry onto the polishing pad 140 via the slurry applicator 142. In some embodiments, as the polishing pad 140 rotates, the pad reconditioner 170 continuously reconditions the polishing pad 140. Alternatively, the pad reconditioner 170 is activated during a cessation in polishing.

The polishing apparatus 100 is controlled to provide improved polishing performance for removal of particular types of films and for polishing of various types of substrates. Selection of the size, dimensions and shape of the polishing pad 140 is a first determinant of the polishing performance of the apparatus 100. As the polishing operation proceeds, it is controlled by varying the angular velocity and direction of motion of the wafer 110, the angular velocity and direction of motion of the polishing pad 140, the downward pressure applied to the wafer 120 by the polishing pad 140, and, for some pad shapes and sizes, the position of the polishing pad 140 with respect to the wafer 120. For example, the polishing apparatus 100 may be controlled to oscillate the conical polishing pad 140 about the center of the wafer 120 so that the portion of the pad 140 near the base of the cone, which moves at a high linear velocity with respect to a point on the wafer surface by virtue of the angular motion of the cone, is frequently positioned overlying points on the wafer surface near the center of the wafer, which move with a low linear velocity by virtue of the angular motion of the wafer.

When a polishing step is complete, downward pressure on the polishing assembly 130 is released and the polishing pad 140 is removed from the wafer 120. The cleaning assembly 150 is advanced to the wafer 120 and the cleaning pad 160 is placed into contact with the wafer 120 at a controlled downward pressure.

The above description is meant to be illustrative only and not limiting. Other embodiments of this invention will be obvious to those skilled in the art in view of this disclosure.

What is claimed is:

1. A method of polishing a semiconductor wafer comprising the steps of:

affixing a semiconductor wafer to a turntable having a central axis;

rotating the turntable and affixed semiconductor wafer about the central axis of the turntable at a controlled angular velocity and angular direction;

positioning a polishing pad at a selected location relative to the semiconductor wafer, the polishing pad having an outer conic quadric surface, having a central axis and having a lateral edge substantially perpendicular to the central axis of the turntable in a plane parallel to the plane of the turntable; and pressing the polishing pad into contact with the rotating semiconductor wafer at a controlled pressure.

2. A method according to claim 1 further comprising the step of rotating the polishing pad about the central axis of the polishing pad at a selected angular velocity and angular direction.

3. A method according to claim 2 further comprising the step of reconditioning the polishing pad by bringing the rotating polishing pad into contact with an abrasive material while the polishing pad lateral edge substantially perpendicular to the central axis of the turntable is pressed into contact with the rotating semiconductor wafer.

4. A method according to claim 1 further comprising the steps of:

positioning a cleaning pad at a selected location relative to the semiconductor wafer, the cleaning pad having an outer quadric surface of cylindrical or conic structure with a central axis and a lateral edge substantially perpendicular to the central axis of the turntable in a plane parallel to the plane of the turntable; and pressing the cleaning pad into contact with the rotating semiconductor wafer at a controlled pressure.

5. A method according to claim 1 further comprising the step of applying a controlled flow of slurry onto the polishing pad.

6. A method according to claim 1 wherein the turntable has a radius R and the polishing pad has a conic structure with the cone height H substantially equal to the radius R of the turntable, the polishing pad being positioned to extend substantially from an outer surface of the turntable to the central axis of the turntable.

7. A method of polishing a semiconductor wafer comprising the steps of:

attaching a semiconductor wafer disk to a horizontal planar surface of a rotary disk turntable, the rotary disk turntable having an essentially circular top view and having a substantially vertical central axis;

rotating the rotary disk turntable around the substantially vertical central axis;

positioning a conical polishing pad so that a lateral edge of the conical polishing pad is adjacent to the substantially planar horizontal surface of the semiconductor wafer disk rotating the conical polishing pad around the conical polishing pad central axis; and contacting the lateral edge of the conical polishing pad to the horizontal planer horizontal surface of the semiconductor wafer disk at a controlled pressure.

8. A method according to claim 7 further comprising the steps of:

positioning an abrasive material adjacent to and substantially parallel with a lateral edge of the conical polishing pad, the abrasive pad material being removed from the lateral edge of the conical polishing pad contacting the horizontal planar horizontal surface of the semiconductor wafer disk; and contacting the positioned abrasive material to the conical polishing pad at a controlled pressure so that the conical polishing pad is restored.

9. A method according to claim 8 wherein the abrasive material is constructed from a hard and sharp material.

10. A method according to claim 9 wherein the abrasive material is constructed from diamond particles.

11. A method according to claim 7 further comprising the steps of:

positioning a conical cleaning pad so that a lateral edge of the conical cleaning pad is adjacent to the substantially planar horizontal surface of the semiconductor wafer disk;

rotating the conical cleaning pad around the conical cleaning pad central axis; and contacting the lateral edge of the conical cleaning pad to the horizontal planar horizontal surface of the semiconductor wafer disk at a controlled pressure.

12. A method according to claim 7 further comprising the steps of:

positioning a cylindrical cleaning pad so that a lateral edge of the cylindrical cleaning pad is adjacent to the substantially planar horizontal surface of the semiconductor wafer disk, the cylindrical cleaning pad being circular in a plane perpendicular to the substantially planar horizontal surface of the semiconductor wafer disk and having a substantially horizontal central axis, the substantially horizontal central axis of the cylindrical cleaning pad extending from an edge of the semiconductor wafer disk essentially through the vertical central axis of the rotary disk turntable;

rotating the cylindrical cleaning pad around the horizontal central axis; and contacting a lateral edge of the cylindrical cleaning pad to the horizontal planar horizontal surface of the semiconductor wafer disk at a controlled pressure.

* * * * *

UNITED STATES PATENT AND TRADEMARK OFFICE
CERTIFICATE OF CORRECTION

PATENT NO. : 5,665,656
DATED : September 9, 1997
INVENTOR(S) : Rahul Jairath

It is certified that error appears in the above-identified patent and that said Letters Patent is hereby corrected as shown below:

At column 3, line 49, delete "tipping" and substitute --ripping--.

At column 7, line 8, delete "varioustypes" and substitute --various types--.

Signed and Sealed this

First Day of September, 1998

Attest:

BRUCE LEHMAN

*Attesting Officer*

*Commissioner of Patents and Trademarks*